United States Patent
van Muiswinkel et al.

(10) Patent No.: US 6,724,190 B2
(45) Date of Patent: Apr. 20, 2004

(54) RETROSPECTIVE SELECTION AND VARIOUS TYPES OF IMAGE ALIGNMENT TO IMPROVE DTI SNR

(75) Inventors: Arianne M. C. van Muiswinkel, BR Best (NL); Thomas Jaermann, Zurich (CH)

(73) Assignee: Koninklijke Philips Electronics N.V., Eindhoven (NL)

(*) Notice: Subject to any disclaimer, the term of this patent is extended or adjusted under 35 U.S.C. 154(b) by 19 days.

(21) Appl. No.: 10/146,336

(22) Filed: May 15, 2002

(65) Prior Publication Data

US 2003/0214290 A1 Nov. 20, 2003

(51) Int. Cl.$^7$ ................................. G01V 3/00
(52) U.S. Cl. ........................................ 324/307
(58) Field of Search ................... 324/307, 309

(56) References Cited

U.S. PATENT DOCUMENTS

| | | | |
|---|---|---|---|
| 5,488,297 A | 1/1996 | Nakada | 324/309 |
| 5,539,310 A | 7/1996 | Basser et al. | 324/307 |
| 5,560,360 A * | 10/1996 | Filler et al. | 600/408 |
| 5,572,124 A | 11/1996 | Bito et al. | 324/307 |
| 5,786,692 A | 7/1998 | Maier et al. | 324/307 |
| 5,969,524 A * | 10/1999 | Pierpaoli et al. | 324/307 |
| 6,023,167 A | 2/2000 | DeMeester et al. | 324/318 |
| 6,100,695 A * | 8/2000 | DeMeester et al. | 324/318 |
| 6,265,872 B1 * | 7/2001 | Heid | 324/307 |
| 6,288,540 B1 * | 9/2001 | Chen et al. | 324/300 |
| 6,323,646 B1 | 11/2001 | Zhou et al. | 324/309 |
| 6,463,315 B1 * | 10/2002 | Klingberg et al. | 600/410 |
| 6,522,324 B1 | 2/2003 | Bosma et al. | 345/419 |
| 6,526,305 B1 * | 2/2003 | Mori | 600/410 |
| 2002/0074998 A1 | 6/2002 | Van Den Brink et al. | 324/306 |
| 2002/0114502 A1 | 8/2002 | Beck et al. | 382/131 |

FOREIGN PATENT DOCUMENTS

| | | | |
|---|---|---|---|
| US | WO 00/72038 A1 * | 11/2000 | |
| WO | WO 02/068978 | 9/1902 | G01R/33/00 |
| WO | WO 01/91639 A1 | 12/2001 | |

OTHER PUBLICATIONS

Mori, et al., "Imaging Cortical Association Tracts in the Human Brain Using Diffusion–Tensor–Based Axonal Tracking", Magnetic Resonance in Medicine 47:215–223 (2002).

Courant, et al. "Methods of Mathematical Physics", Interscience Publishers New York, vol. 1, ©1937, pp. 458–459.

* cited by examiner

Primary Examiner—Christopher W. Fulton
Assistant Examiner—Dixomara Vargas
(74) Attorney, Agent, or Firm—Thomas M. Lundin

(57) ABSTRACT

An imaging sequence, which generates a static image data set and a plurality of differently diffusion-weighted data sets, is repeated and the data sets stored in memories ($36_0$, $36_1$, ..., $36_N$). Each data set is reconstructed into corresponding images stored in sub memories ($38_0$, $38_1$, ..., $38_N$). The images are compared macroscopically (40) and shifted (42) into optimal alignment. Local regions of the images are analyzed (44) and adjusted (46) for better conformity. The static images and like spatially encoded images are compared with each other and those outside a preselected similarity threshold are rejected (48). The remaining like images are combined (50) and subject to a diffusion analysis (52) to generate an image of an anisotropic structure in the imaging region. The anisotropic structure and other image information are displayed on a monitor (58).

20 Claims, 5 Drawing Sheets

RETROSPECTIVE SELECTION AND VARIOUS TYPES OF IMAGE ALIGNMENT TO IMPROVE DTI SNR

BACKGROUND OF THE INVENTION

The present invention relates to medical imaging arts. In particular, it relates to the imaging, tracking, and displaying of neural fibers and fiber bundles by diffusion tensor magnetic resonance imaging (DT-MRI), and will be described with particular reference thereto. However, the invention will also find application in conjunction with tracking and graphical rendering of other types of fibrous structures, as well as with other imaging modalities.

Nerve tissue in human beings and other mammals includes neurons with elongated axonal portions arranged to form neural fibers or fiber bundles along which electro-chemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities, as well as research studies on brain function, can benefit from non-invasive imaging and tracking of the axonal fibers and fiber bundles. In particular, diffusion tensor magnetic resonance imaging (DT-MRI) has been shown to provide sufficient image contrast to image axonal fiber bundles. In the DT-MRI technique, diffusion-sensitizing magnetic field gradients are applied in the excitation/imaging sequence so that the magnetic resonance images include contrast related to the diffusion of water or other fluid molecules. By applying the diffusion gradients in selected directions during the excitation/imaging sequence, diffusion weighted images are acquired from which apparent diffusion tensor coefficients are obtained for each voxel location in image space.

Fluid molecules diffuse more readily along the direction of the axonal fiber bundle as compared with directions partially or totally orthogonal to the fibers. Hence, the directionality and anisotropy of the apparent diffusion coefficients tend to correlate with the direction of the axonal fibers and fiber bundles.

Extraction of fibrous structure information from DT-MRI images is computationally intensive, with processing times typically extending from several tens of minutes to an hour or more for clinically valuable images. In a clinical setting, it is unrealistic to expect a subject to remain motionless for these extended periods of time. Even with movement restricting devices, the subject is not totally immobile, and can still move enough to create distortions in resultant images. Additionally, distortions apart from subject motion can occur, degrading resultant images.

The present invention contemplates an improved apparatus and method that overcomes the aforementioned limitations and others.

SUMMARY OF THE INVENTION

In accordance with one aspect of the present invention, a method of diffusion-weighted magnetic resonance imaging is provided. A plurality of static image representations and a plurality of diffusion image representations, with each of a plurality of diffusion weightings, of the same region of interest in a subject are generated. The static images and the like diffusion weighted images are aligned. Images that differ from other static and like diffusion weighted images are rejected. The non-rejected static images and the non-rejected diffusion weighted images with like diffusion weightings are combined. The combined static and diffusion-weighted images are analyzed to image an isotropic structure.

In accordance with another aspect of the present invention, a method of diffusion tensor magnetic resonance imaging is provided. A static and a plurality of differently diffusion weighted magnetic resonance data sets are collected, each representing the same spatial region within a subject. The collecting step is repeated to generate a plurality of static data sets and a plurality of diffusion weighted data sets corresponding to each diffusion weighting. The data sets are reconstructed into image representations. The image representations are adjusted for better spatial conformity. Static images that fail to exhibit a predetermined similarity to other static images are rejected. Similarly, diffusion weighted images that fail to exhibit a predetermined similarity to other diffusion-weighted images of like diffusion weighting are rejected. The remaining static images and like diffusion weighted images are combined. In at least a region of interest, apparent diffusion coefficient tensors are calculated for each volume of a region of interest of the remaining images. Eigenvalues and Eigenvectors are extracted from the diffusion coefficient tensors. An anisotropic structure is tracked with the Eigenvalues and Eigenvectors. A human-readable display of the tracked anisotropic structure is generated.

In accordance with another aspect of the present invention, a magnetic resonance apparatus is provided. A main magnet assembly generates a substantially uniform main magnetic field through an imaging region. A gradient coil assembly superimposes gradient magnetic fields on the main magnetic field. A radio frequency coil assembly transmits radio frequency pulses into the imaging region. A radio frequency receiver receives and demodulates magnetic resonance signals from the imaging region. A data memory stores static and diffusion weighted data sets of a common region of a subject in the imaging region. A reconstruction processor reconstructs the data sets into static and diffusion weighted images. A comparator compares the static images with each other and like diffusion weighted images with each other. An image rejection processor discards images dissimilar to other like diffusion weighted and static images by more than a predetermined threshold. An image combining means combines the remaining static and diffusion weighted images into combined static and diffusion weighted images. A diffusion analysis processor (1) calculates a diffusion tensor coefficient from the combined images for each voxel of at least a region of interest, (2) creates Eigenvectors from the diffusion tensors, and (3) tracks an anisotropic structure with the Eigenvectors. A video processor and monitor generate a human-viewable display of the tracked anisotropic structure.

One advantage of the present invention resides in more accurate diffusion data.

Another advantage of the present invention resides in a reduced occurrence of imaging artifacts.

Yet another advantage of the present invention resides in increased signal to noise.

Numerous additional advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
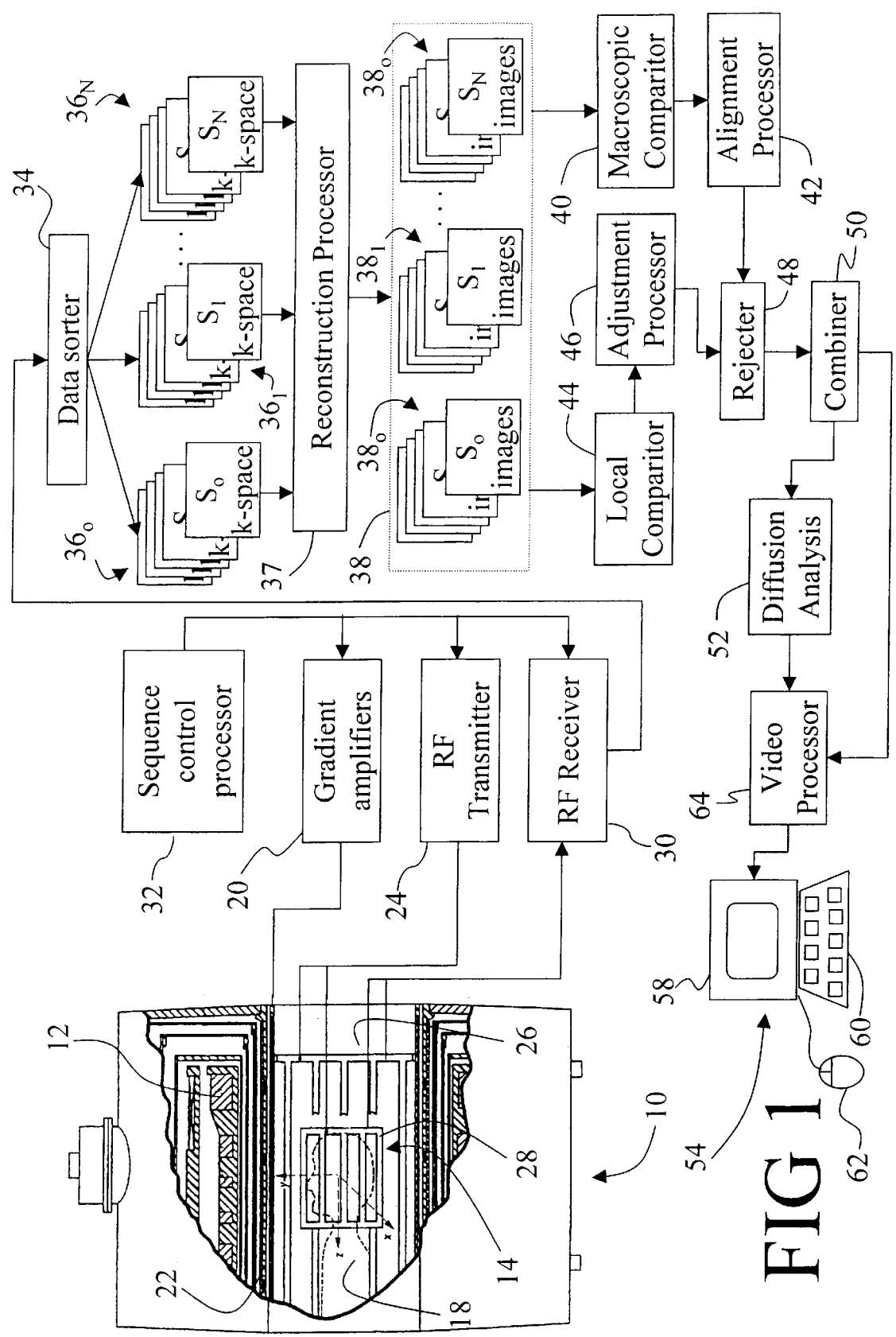
FIG. 1 is a diagrammatic illustration of an exemplary magnetic resonance imaging (MRI) technique in accordance with the present invention.

With reference to FIG. 1, a magnetic resonance imaging (MRI) scanner 10 typically includes superconducting or resistive magnets 12 that create a substantially uniform, temporally constant main magnetic field $B_0$ along a z-axis through an examination region 14. Although a bore-type magnet is illustrated in FIG. 1, the present invention is also applicable to open magnet systems and other types of MRI scanners. Imaging is conducted by executing a magnetic resonance excitation and readout sequence with the subject being imaged, e.g. a patient 18, placed at least partially within the examination region 14, typically with the region of interest at an isocenter of the magnet 12. For diffusion tensor MRI imaging of the brain region, the patient's head is preferably placed at the isocenter.

The magnetic resonance sequence includes a series of RF and magnetic field gradient pulses that are applied to the subject 16 to manipulate and detect magnetic resonance. More specifically, gradient pulse amplifiers 20 apply current pulses to a whole body gradient coil assembly 22 to create magnetic field gradients along x, y, and z-axes of the examination region 14. In diffusion-weighted MRI, selected motion-sensitizing magnetic field gradients are applied to detect diffusion of body fluid molecules moving in selected directions.

An RF transmitter 24, preferably digital, applies RF pulses or pulse packets to a whole-body RF coil 26 to transmit RF pulses into the examination region. The RF pulses are used to saturate, excite resonance, invert magnetization, refocus resonance, or manipulate resonance in selected portions of the examination region.

For whole-body applications, the resulting resonance signals, generated as a result of a selected manipulation, are received by the whole-body RF coil 26. Alternately, for generating RF pulses in limited regions of the subject, local RF coils are placed contiguous to the selected region for transmission and/or reception. For brain imaging, an insertable local head coil 28 is preferably employed.

Regardless of the RF coil configuration and the application, the resultant RF magnetic resonance signals are received and demodulated by an RF receiver 30, preferably a digital receiver. A sequence control processor 32 controls the gradient pulse amplifiers 20, the RF transmitter 24, and the RF receiver 30 to produce integrated MRI pulse sequence and readout waveforms that generate the magnetic resonance signals and optional echoes, provide appropriate encoding gradients to spatially and diffusion encode the resultant MR response, and coordinate MR pickup and receive operations.

The MRI sequence typically includes a complex series of magnetic field gradient pulses and/or sweeps transmitted by the gradient coil 22 which, along with selected RF pulses transmitted by RF coils 26, result in a train of magnetic resonance echoes. Some of the echoes have no motion sensitization. Other echoes of each train are motion sensitized with motion sensitization gradients in N diffusion weighting directions, indexed 1 ... N. Preferably, N≧6. The resultant magnetic resonance data is sorted by a sorter 34 and stored in k-space memories 36.

First static and diffusion-weighted data sets are acquired and sorted into corresponding k-space memories $36_0$, $36_1$, ... $36_N$. The first static and diffusion-encoded data sets are reconstructed by a reconstruction processor 37 into corresponding images and stored in sub-memories $38_0$, $38_1$, ... $38_N$) of a data memory 38. Once the first data sets have been stored, the scanner 10 initiates a second scan sequence of the same region of interest within the subject 18 as the first, producing second data sets substantially the same as the first data set. The second data sets are sorted and stored in the respective k-space memories $36_0$, $36_1$, ... $36_N$. A number M iterations of the scan are performed, each resulting data set being stored in the corresponding k-space memory and reconstructed into images which are stored in the respective image sub-memories $380, 38_1, ... 38_N$.

Once M iterations of the preferred scan sequence have been performed and reconstructed, the images are compared to each other. Preferably, the images are compared by a macroscopic comparitor 40, which compares the images with reference to global translation, rotation or other displacement of the image as a whole. Such displacements may be indicative of shifting of the region of interest between scan sequences. Displacements identified by the macroscopic comparitor 40 are corrected by an alignment processor 42 that shifts the images with reference to each other to align them. Because the first $S_0$–$S_N$ images are reconstructed from data sets collected concurrently, the first collected $S_0$–$S_N$ images can be expected to have like displacements. The same is true for the second, third, ..., and $M^{th}$ collected $S_0$–$S_N$ images. In one embodiment, the $S_0$ images are compared with the other $S_0$ images, the $S_1$. images are compared with the other $S_1$ images, etc. In this manner, each of the M $S_0$ images are aligned independent of the aligning of the $S_1$, ..., $S_N$ images. In a second embodiment, $S_0$ images are compared by the macroscopic comparator 40 and the corresponding $S_1$, ..., $S_N$ images are subject to the same displacement during alignment.

The images from the data memory 38 are also compared on a local scale by a local comparitor 44. The local comparitor 44 identifies isolated distortions and non-uniformities between the images. Distortions that are detected by the local comparitor 44 might indicate inhomogeneities in the magnetic field $B_0$, and other anomalies. An adjustment processor 46 applies local adjustment algorithms to the images to further align the images. Alternately, corresponding $S_0$–$S_N$ images collected at the same time can be subject to a common local adjustment. Because different motion sensitivity can result in different distortions, each of the contemporaneous $S_0$–$S_N$ images can be initially adjusted by a like adjustment followed by fine-tuning each image adjustment.

After processing by the alignment and adjustment processors 42, 46, images that deviate from other data sets by more than pre-determined criteria are rejected by a rejection processor 48. Various comparison routines are contemplated. In one embodiment, all $S_0$ images are averaged. The individual images are compared to the average. Any that deviate beyond pre-selected criteria are rejected. The remaining images are averaged again, and the process repeated. The $S_1$–$S_N$ images are processed analogously. Of course, information about which $S_0$ images were rejected can be utilized in the $S_1, \ldots, S_N$ image processing. For example, averaging could be limited to images contemporaneous with $S_0$ images that were accepted. In another embodiment, all $S_0$ images are compared with all others individually to derive a coincidence factor. Images with coincidence factors outside of selected similarity are rejected. The $S_1$–$S_N$ images are treated analogously. The accepted $S_0$ images are combined with each other by an combiner 50 into a single, combined image. The combiner combines the S1, S2, etc. images analogously.

The combined $S_0$–$S_N$ images are processed by a diffusion analyzing processor 52. In the preferred embodiment, the diffusion analyzing processor 52 obtains apparent diffusion coefficients (ADC's) with selected directions by linear regression of images with different diffusion weightings. The ADC for selected directions (i,j) are determined by acquiring a diffusion-weighted image $S_{i,j}$ diffusion weighted in the (i,j) direction which relates to a static image $S_0$ according to:

$$S_{i,j} = S_0 e^{-B \cdot ADC_{i,j}} \quad (1),$$

where B is a magnetic field parameter and $ADC_{i,j}$ is the apparent diffusion coefficient for the (i,j) direction. The ADC is calculated from equation (1) as:

$$ADC_{i,j} = -\frac{1}{B} \ln\left(\frac{S_{i,j}}{S_o}\right) \quad (2).$$

Beneficially, image contrast resulting from mechanisms other than the diffusion weighting, such as $T_1$, $T_2$, $T_2{}^*$, and like image contrast mechanisms, are substantially removed by the image linear regression. A diffusion tensor processor calculates a plurality of ADC values on a per voxel basis according to equation (2) to construct a diffusion tensor map. Six diffusion directions typically provide sufficient information to construct the diffusion tensor at each voxel.

Figure 2:
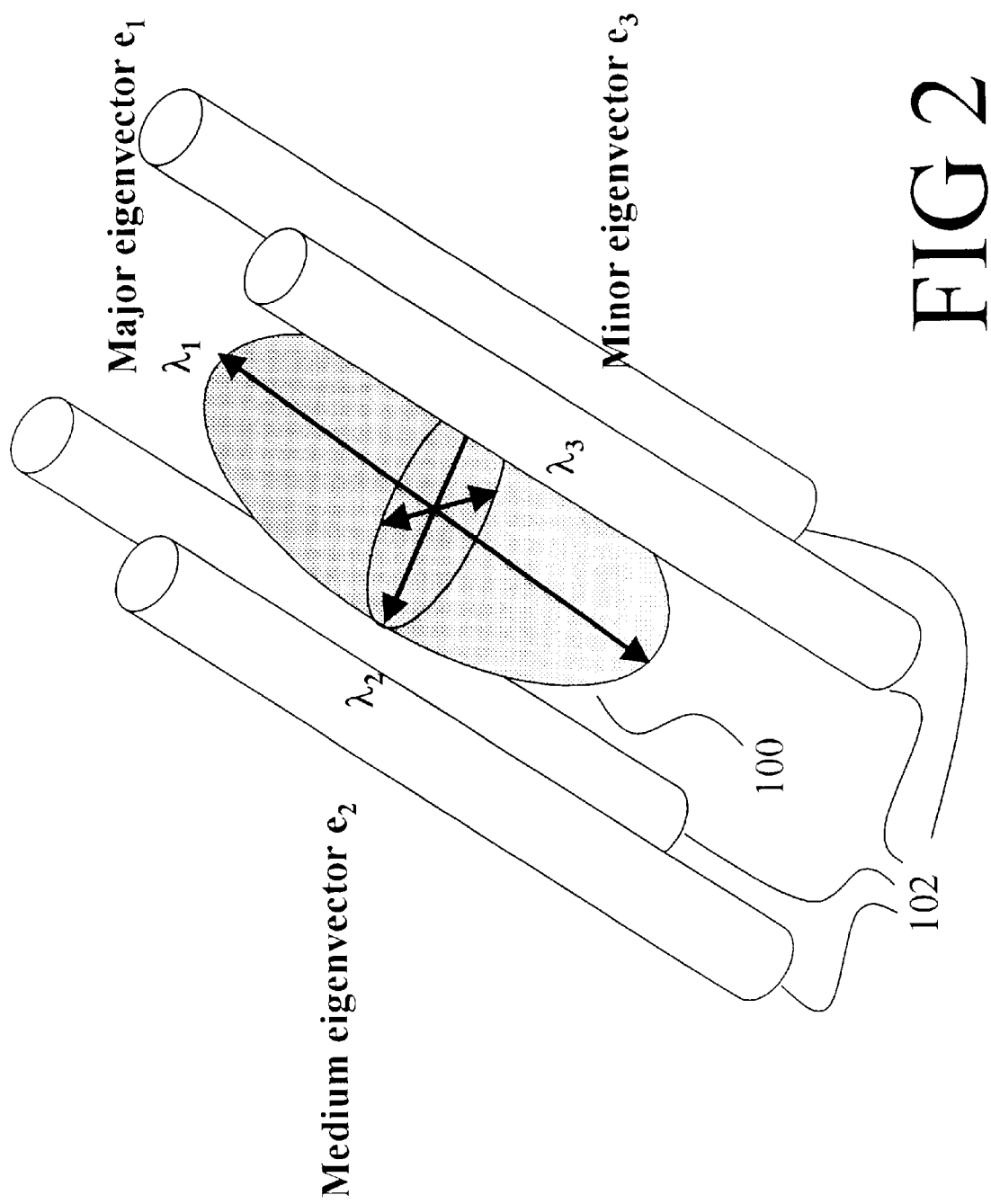
FIG. 2 is a perspective representation of eigenvectors and eigenvalues of a diffusion coefficient tensor and their relationship with axonal fibers or fiber bundles.

With continuing reference to FIG. 1 and with further reference to FIG. 2, the diffusion tensor eigenvectors and eigenvalues at each voxel are obtained to construct an eigenvector/eigenvalue map.

In a preferred embodiment, the diffusion tensor is ordered using Jacobi's method of multiplicative variation or another mathematical technique to obtain the eigenvectors and eigenvalues. As seen in FIG. 2, the eigenvalues $\lambda_1, \lambda_2, \lambda_3$ and the corresponding eigenvectors $e_1, e_2, e_3$ of the diffusion tensor have useful physical significance. The largest eigenvalue is designated in FIG. 2 as $\lambda_1$. The corresponding eigenvector $e_1$ is called the major eigenvector, and aligns with the spatial direction having the highest diffusion coefficient. The remaining eigenvalues $\lambda_2, \lambda_3$ have corresponding eigenvectors $e_2, e_3$ called the medium and minor eigenvectors. These eigenvectors $e_2, e_3$ are orthogonal to $e_1$ and to each other and align with spatial directions having lower diffusion coefficients. The relative values of the eigenvalues $\lambda_1, \lambda_2, \lambda_3$ are indicative of the spatial orientation and magnitude of the diffusion tensor anisotropy.

The interface device 54, such as a personal computer or workstation, preferably includes a graphical display 58, a keyboard 60, a mouse or other pointing device 62, and/or similar input or output elements. A video processor 64 creates a viewable image representation of the subject 18, for example a slice or other two-dimensional surface through one of the images, such as the static image on the display 58. Preferably, the display is divided into quadrants. A 3D rendering is shown in one quadrant and three orthogonal slices that intersect at a common point are displayed in the other three quadrants. The display also includes a superimposed interactive pointing device or other graphical selection tool known to the art that is operable by the user through the mouse 62, the keyboard 60, or other input device. Preferably, the pointing device marks the common intersection point and is displayed in all four quadrants. Clicking the mouse or the like can be used to select the voxel denoted by the pointing device.

The eigenvectors and eigenvalues for the selected starting point are calculated. A tracking or projection processor determines that direction of the largest eigenvector and identifies the next voxel in that direction. An end criteria processor determines if any of pre-selected end or branching criteria are met. If not, the process is repeated for the identified next voxel. The calculated eigenvectors and eigenvalues are also stored in the map. Preferably, the previewing process is also performed in the negative eigenvector direction of the start point, i.e. the fiber is grown in both directions from the starting point. The voxels for which eigenvectors are calculated in this process form a filament track, which is stored in a temporary image memory.

Figure 3:
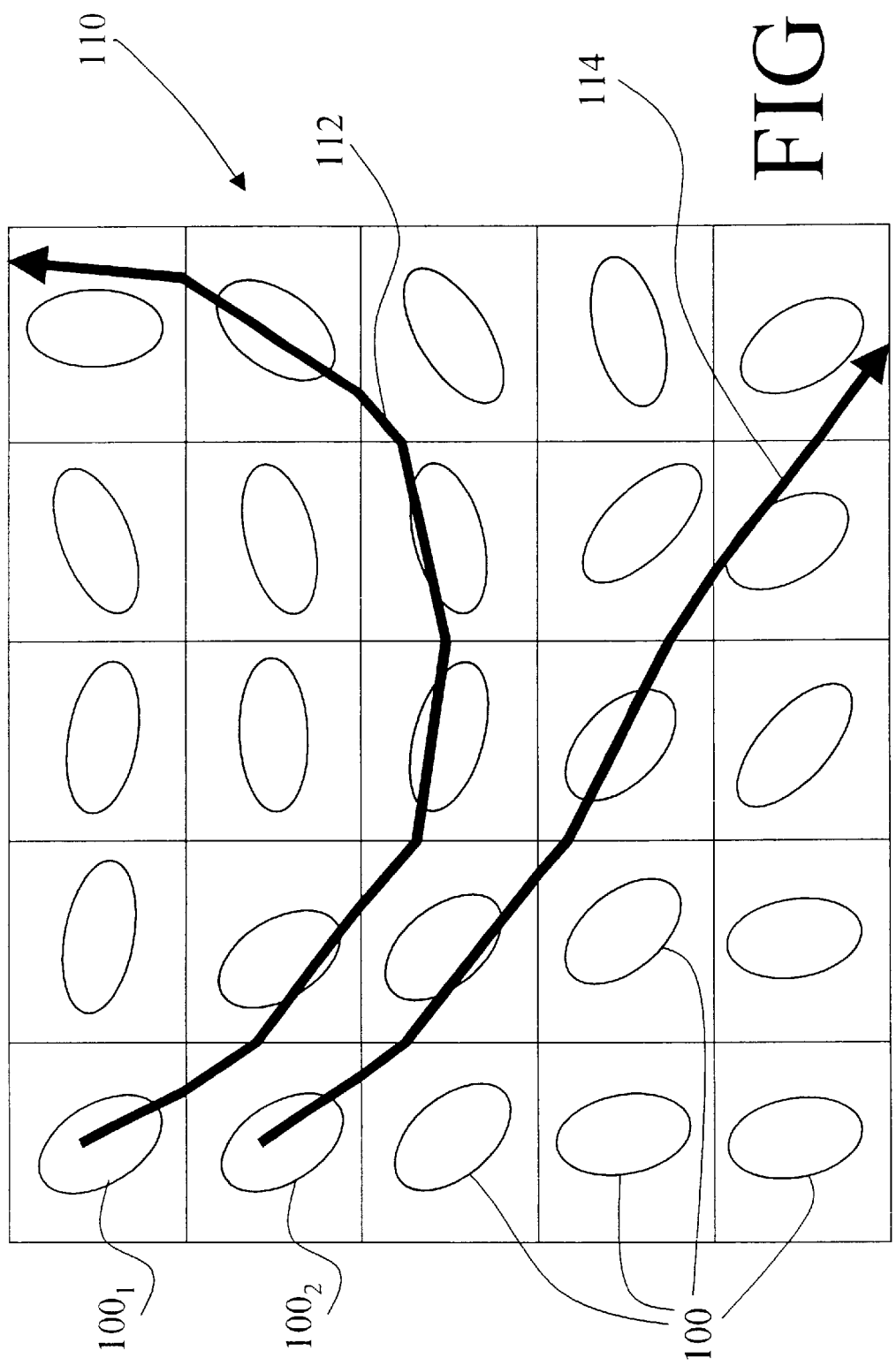
FIG. 3 is a two-dimensional representation of the fiber tracking.

With continuing reference to FIGS. 1, and 2, and with further reference to FIG. 3, the tracking processor iteratively tracks a fiber using a tracking direction given by the major eigenvector $e_1$ of the diffusion tensor of the seed voxel and each subsequent voxel. FIG. 3 shows a first fiber representation track 112, which starts at a starting point 100$_1$, and a second fiber representation track 114, which starts at a starting point 100$_2$.

Although unidirectional tracking is shown in FIG. 3, it will be appreciated that tracking can optionally occur bi-directionally, i.e. extending in both the $e_1$ and the $-e_1$ directions, to provide more complete fiber tracking. Furthermore, although an exemplary two-dimensional array of voxels is shown in FIG. 3, it will be appreciated that the tracking will generally occur three-dimensionally. A video processor 64 highlights the track of voxels from the temporary memory and superimposes the highlighted voxels on a human readable image displayed on the monitor 58. Additionally, a limited visualization technique is preferably utilized, e.g. a polyline technique, to minimize processor usage and expedite visualization of the fiber. Calculating only the eigenvectors of only one fiber thread or a small bundle of threads saves the extended processing of the entire eigenvector map.

By moving the cursor from voxel to voxel, the user can quickly visualize the ends and routes of fibers of potential interest. The user uses this information to a subregion of voxels, which correspond to the fiber bundle of interest. With this information, a limited subset of voxels can be selected for diffusion imaging.

With continuing reference to FIG. 2, the eigenvectors and eigenvalues are geometrically representable by an ellipsoid 100 whose long axis aligns with eigenvector $e_1$, i.e. with the direction with the highest diffusion coefficient. The deviation of the ellipsoid 100 from a perfect sphere is representative of the anisotropy of the diffusion tensor, that is, a voxel having a spherical representation exhibits equal diffusion in all directions. An anisotropic diffusion coefficient tensor can reflect the influence of neural fiber bundles 102 which tend to inhibit diffusion in directions partially or totally orthogonal to the fibers 102, e.g. the directions of eigenvectors $e_2$, $e_3$. In contrast, diffusion parallel to the fibers 102, i.e. along the direction of the major eigenvector $e_1$, is larger than along the $e_2$, $e_3$ directions.

An anisotropy map such as a fractional anisotropy map known to the art, or other anisotropy image map that emphasizes the anisotropy magnitude, is optionally calculated from the eigenvectors/eigenvalues map. In a suitable embodiment, the fractional anisotropy is calculated on a per voxel basis according to:

$$FA = \begin{cases} \sqrt{\dfrac{3 \sum_{i=1,2,3} (\lambda_i - \lambda_{avg})^2}{2 \sum_{i=1,2,3} \lambda_i^2}}, & \sqrt{\dfrac{1}{3}(\lambda_1^2 + \lambda_2^2 + \lambda_3^2)} \geq 0.10 \\ 0.10, & \sqrt{\dfrac{1}{3}(\lambda_1^2 + \lambda_2^2 + \lambda_3^2)} < 0.10 \end{cases} \quad (3),$$

where $$\lambda_{avg} = \frac{\lambda_1 + \lambda_2 + \lambda_3}{3} \quad (4).$$

The anisotropy map of equations (3) and (4) has been found to be particularly suitable for use in selecting fibrous regions for diffusion fiber tracking. As is known to those skilled in the art, the anisotropy map provides a convenient image representation of the anisotropy magnitude.

Preferably, the video processor 64 produces a 3D rendering of the diffusion image superimposed on the $S_0$ image which combined image can be rotated, resized, or otherwise manipulated by the user via the mouse, keyboard, or other input device.

Figure 4:
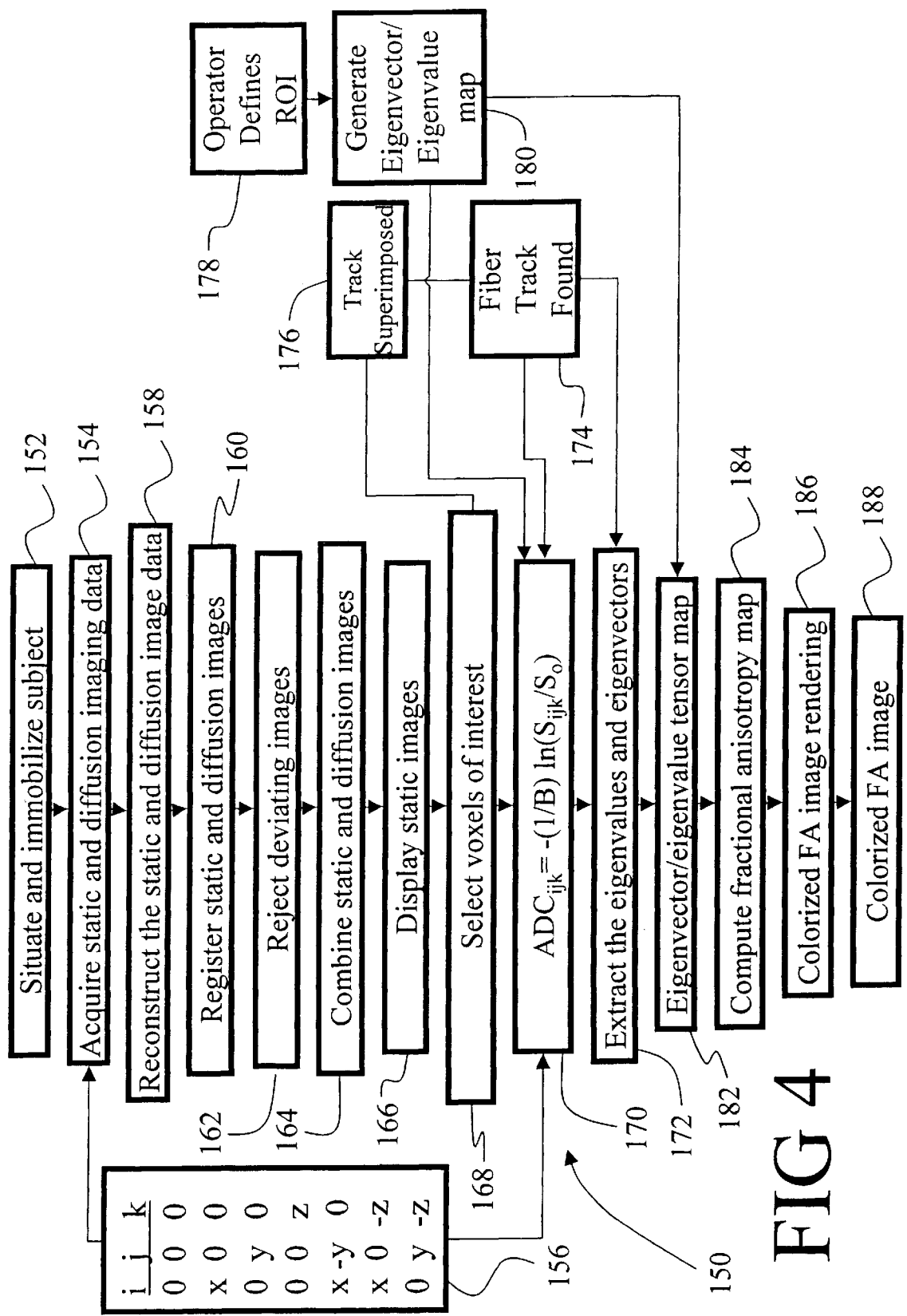
FIG. 4 is a flowchart outlining an exemplary process for acquiring diffusion tensor magnetic resonance imaging data and for computing an apparent diffusion coefficient tensor map an eigenvalue/eigenvector map, and a fractional anisotropy map therefrom.

With reference to FIG. 4, a subject is situated and immobilized within the magnetic resonance imaging (MRI) scanner in a step 152. As DT-MRI imaging includes acquisition of a large number of images over a substantial period of time, the subject is preferably immobilized to minimize motion blurring and motion-induced image distortion.

The DT-MRI imaging data is acquired in a step 154 using imaging sequences such as spin-echo sequences that include additional magnetic field gradient pulses that produce the selected diffusion weighting. Preferably, a multiple-echo sequence is used in which data is acquired in each echo train with several diffusion weightings 156 corresponding to selected apparent diffusion coefficient (ADC) components of the diffusion coefficient tensor. Six apparent diffusion coefficients are generally sufficient to describe the tensor. In the illustrated embodiment, six diffusion weightings 156 are collected, with magnetic field gradient pulses applied in the (x, 0, 0), (0, y, 0), (0, 0, z), (x, −y, 0), (x, 0, −z), and (0, y, −z) directions, along with an unweighted image (0, 0, 0). However, other combinations of diffusion weighting can be used instead. Using a multiple-echo sequence advantageously reduces data acquisition time and minimizes motion-induced blurring or misregistration across images. To improve the signal-to-noise ratio, data for a plurality of images are preferably collected for each diffusion weighting. The imaging sequence also optionally includes additional RF pulses or magnetic field gradient pulses or sweeps to compensate for magnetic field gradient-induced eddy currents and other imaging artifacts.

Image data collected in the step 154 is reconstructed in a step 158 to form static and diffusion weighted image reconstructions $S_0$ and $S_{ijk}$ where ijk indicates the various diffusion weightings 156. The inverse Fourier transform reconstruction known to the art is suitably used, although other reconstruction methods can also be employed.

In spite of precautions such as subject immobilization 152, the DT-MRI images nonetheless typically include subject motion-related misregistration across images. Hence, in a step 160 an image registration is performed to register and align the $S_0$–$S_N$ images, respectively. In a step 162, any images that deviate significantly from the other, like images are discarded. Such discarding can be done without loss of critical information when several redundant images are acquired and combined. Discarding deviating images typically improves the averaged image signal-to-noise ratio. The accepted $S_0$ images are combined 164, as are the accepted $S_1$, images, etc.

The operator displays static images 166 and using the cursor, selects 168 voxels of interest. For each selected voxel, the apparent diffusion coefficients (ADC's) are calculated according to equation (2), in a step 170. The eigenvalues and eigenvectors are extracted in a step 172. In a preferred embodiment, the step 168 orders the voxel diffusion tensors to extract the eigenvectors and eigenvalues map. The track through the selected voxel is traced in a step 174 by finding the direction of the largest, determining the voxel toward which it is pointing, and finding the eigenvectors/eigenvectors for that voxel. The track is colorized and superimposed 176 on the displayed static image.

After viewing a number of fiber tracks, the operator defines a region of interest at a step 178. In an eigenvector/eigenvalue map-generating step 180, the eigenvectors/eigenvalues are calculated for each voxel in the defined region of interest and loaded into an eigenvector/eigenvalue tensor map 182.

Optionally, a fractional anisotropy (FA) map is computed in a step 184 in accordance with equations (3) and (4). The FA map is preferably rendered in a step 186, for example by colorizing the voxels based on the FA value, to obtain a colorized FA image 188 for display to an associated user. Various techniques for identifying the region of interest in step 178 are contemplated. For example, the operator can select a plane through which the fiber bundle passes. The fiber bundle is identified in the plane from the voxel fractional anisotropy map. Based on the fractional anisotropy, the bundle is grown from plane to plane until an end of the bundle is reached.

Figure 5:
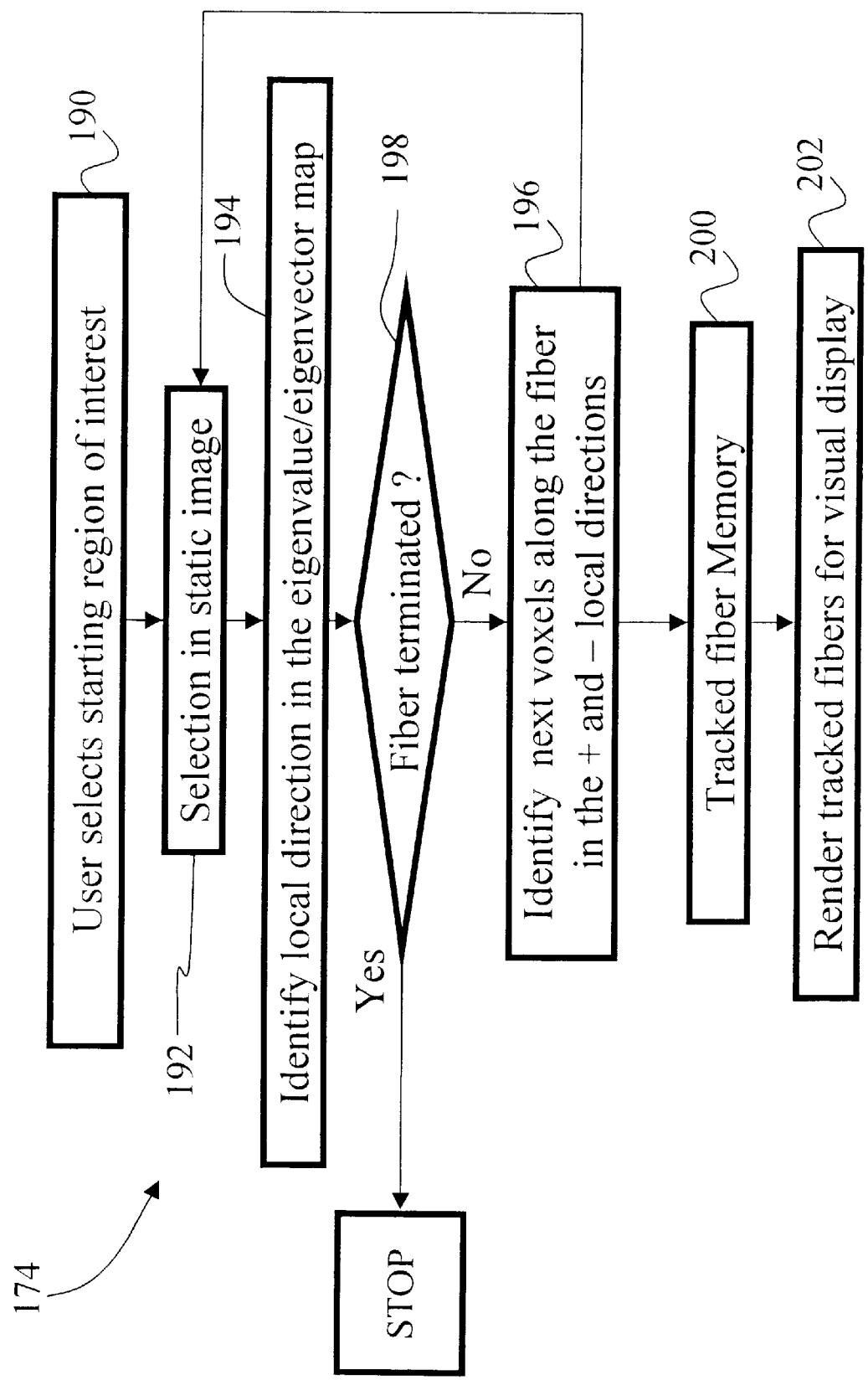
FIG. 5 is a flowchart illustrating the detection and rendering of the fiber bundle.

With reference to FIG. 5, in the step 174, the user selects 190 a starting region of interest. In a preferred embodiment, the selection 192 is made with reference to the static image. The selection is preferably indicated by the user graphically using a mouse pointer or other graphical selection device. The selected region of interest is preferably a single voxel, a group of voxels sharing a common plane, or a three-dimensional region of voxels.

The eigenvectors and eigenvalues of the selected starting voxel are calculated in a step 192. A local direction is identified in a step 194 corresponding to the major eigenvector $e_1$ direction (see FIG. 2). Next voxel(s) are identified in a step 196, which neighbor the current voxel along the local direction (see FIG. 3). In a preferred embodiment, both positive and negative (bi-directional) tracking is performed by identifying next voxels in both positive and negative local $e_1$ directions. As the tracking progresses bi-directionally, a positive fiber end is grown by successively identifying voxels in the positive local direction while a negative fiber end is grown by successively identifying voxels in the negative local direction. Of course, unidirectional fiber tracking is also contemplated, and may be preferable in certain situations such as tracking a fiber extending away from a large, dense region of deep white matter.

The method of FIG. 5 iteratively repeats the steps 192, 194, and 196, to illuminate the tracked fiber either unidirectionally or bi-directionally. Preferably, a decision step 198 within the iterative loop checks for a termination of a progressing fiber end. One suitable fiber termination criterion includes a fractional anisotropy below a selected value, e.g. at or below the FA=0.10 threshold used in equation (3). This criterion is met when the major eigenvector $e_1$ becomes comparable to the medium eigenvector $e_2$. Since a low fractional anisotropy (FA) corresponds with a highly isotropic diffusion tensor, it is reasonable to assume that a FA value that drops below a selected threshold corresponds to the terminal point of a tracked fiber, that is, that diffusion in the region has essentially ceased.

Another suitable fiber termination criterion is a change in local direction between successive voxels, which is greater than a selected angle. A large change in local direction is likely to correspond to a fiber branching point. Optionally, instead of terminating at such an apparent branching point, a new region of interest is defined at or around the branching point and the tracking process 170 is repeated for the new region of interest to track the branching fibers or fiber bundles.

Yet another suitable fiber termination criterion is entrance of the progressing fiber into an ending region of interest selected by the user in the step 190. Various combinations of the exemplary terminating criteria described herein, and/or addition or substitution of other suitable terminating criteria, are also contemplated.

The identified voxels that represent the tracked fiber are stored in a memory 200. The tracked fiber representation is preferably denoted by a distinctive color and graphically displayed in a step 202 for visualization by a human user, e.g. a 3D curvilinear rendering illustrating the path of the fiber. The fiber is advantageously displayed superimposed on the starter image to give the user anatomical landmarks. It is to be understood that other types of rendering can also be employed. The rendering is preferably interactive so that the user can highlight selected fibers, rotate the three-dimensional fiber representation, or otherwise manipulate the data.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of diffusion tensor magnetic resonance imaging comprising:
   a) collecting a static and a plurality of differently diffusion weighted magnetic resonance image data sets, each data set representing the same spatial region within a subject;
   b) repeating the collecting step a) to generate a plurality of static data sets and a plurality of diffusion weighted data sets corresponding to each diffusion weighting;
   c) reconstructing the data sets into image representations;
   d) adjusting the image representations for better spatial conformity;
   e) rejecting static image representations that fail to exhibit a pre-determined similarity to other static images;
   f) rejecting diffusion weighted image representations that fail to exhibit a predetermined similarity to other diffusion weighted images of like diffusion weighting;
   g) combining remaining static images and like diffusion weighted image representations;
   h) in at least a region of interest of the remaining images, calculating apparent diffusion coefficient tensors for each voxel of the region of interest;
   i) extracting eigenvalues and eigenvectors from the diffusion coefficient tensors;
   j) tracking an anisotropic structure with the eigenvalues and the eigenvectors;
   k) generating a human readable display of the tracked anisotropic structure.

2. The method as set forth in claim 1, wherein the step d) of adjusting the image representations includes:
   analyzing the data sets for macroscopic shifts indicative of patient motion; and
   spatially adjusting the individual image representations.

3. The method as set forth in claim 1, wherein the step (d) of adjusting the image representations includes:
   identifying local non-uniformities in the image representations that differ from the same regions in other image representations; and
   adjusting the local non-uniformities.

4. The method as set forth in claim 3, further including:
   applying sheer correction processes to correct the local non-uniformities.

5. The method as set forth in claim 1, wherein:
   the adjusting step (d) includes comparing like diffusion weighted image representations; and
   further including adjusting the like diffusion weighted image representations for greater conformity.

6. The method as set forth in claim 1, wherein:
   the adjusting step (d) includes comparing static image representations; and
   further including adjusting each static image representation and contemporaneous diffusion weighted image representations analogously.

7. The method as set forth in claim 1, wherein:
   the adjusting step (d) includes comparing static image representations; and,
   the rejecting step (f) includes rejecting diffusion weighted image representations that are contemporaneous with rejected static image representations.

8. The method as set forth in claim 1, wherein the tracking step (j) includes:
   analyzing an anisotropy of the eigenvectors of each voxel to find a relative diffusion measurement for each voxel.

9. The magnetic resonance apparatus as set forth in claim 8, further including:
   highlighting voxels with relative diffusion measurements above a predetermined threshold and displaying an image on a human viewable monitor.

10. The magnetic resonance apparatus as set forth in claim 1, further including:
    computing fractional anisotropy values for at least a plurality of the voxels.

11. A method of diffusion tensor magnetic resonance imaging comprising:
    a) collecting a static and a plurality of differently diffusion weighted magnetic resonance image data sets, each data set representing the same spatial region within a subject;

b) repeating the collecting step a) to generate a plurality of the data sets;

c) reconstructing the data sets into image representations;

d) rejecting data sets whose static or like diffusion weighted image representations that fail to exhibit a pre-determined similarity to each other;

e) aligning like diffusion weighted image representations;

f) combining non-rejected and aligned static images and non-relected and aligned like diffusion weighted image representations;

g) in at least a region of interest of the remaining images, calculating an apparent diffusion coefficient tensor;

h) extracting eigenvalues and eigenvectors from the diffusion coefficient tensor;

i) tracking an anisotropic structure with the eigenvalues and the eigenvectors;

j) generating a human readable display of the tracked anisotropic structure.

12. A method diffusion tensor magnetic resonance imaging comprising:

a) collecting a static and a plurality of differently diffusion weighted magnetic resonance image data sets, each data set representing the same spatial region within a subject;

b) repeating the collecting step a) to generate a plurality of static data sets and a Plurality of diffusion weighted data sets corresponding to each diffusion weighting;

c) reconstructing the data sets into image representations;

d) adjusting the image representations for better spatial conformity;

e) rejecting static image representations that fail to exhibit a pre-determined similarity to other static images;

f) rejecting diffusion weighted image representations that fail to exhibit a predetermined similarity to other diffusion weighted images of like diffusion weighting by comparing the image representations with an average of like diffusion weighted image representations;

g) combining remaining static images and like diffusion weighted image representations;

h) in at least a region of interest of the remaining images, calculating apparent diffusion coefficient tensors for each voxel of the region of interest;

i) extracting eigenvalues and eigenvectors from the diffusion coefficient tensors;

j) tracking an anisotropic structure with the eigenvalues and the eigenvectors;

k) generating a human readable display of the tracked anisotropic structure.

13. A method of diffusion tensor magnetic resonance imaging comprising:

a) collecting a static and a plurality of differently diffusion weighted magnetic resonance image data sets, each data set representing the same spatial region within a subject;

b) repeating the collecting step a) to generate a plurality of static data sets and a plurality of diffusion weighted data sets corresponding to each diffusion weighting;

c) reconstructing the data sets into image representations;

d) comparing static image representations;

e) adjusting the static image representations based on the comparing step (d) for greater conformity;

f) in at least a region of interest of the remaining images, calculating apparent diffusion coefficient tensors for each voxel of the region of interest;

g) tracking an anisotropic structure based on diffusion coefficient tensors;

h) generating a human readable display of the tracked anisotropic structure.

14. A magnetic resonance apparatus comprising:

a main magnet assembly for generating a substantially uniform main magnetic field through an imaging region;

a gradient coil assembly for superimposing gradient magnetic fields on the main magnetic field;

a radio frequency coil assembly for transmitting radio frequency pulses into the imaging region;

a radio frequency receiver for receiving and demodulating magnetic resonance signals from the imaging region;

a data memory for storing static and diffusion weighted data sets of a common region of a subject in the imaging region;

sets into a reconstruction processor that reconstructs the data sets into static and diffusion weighted images;

a comparator that compares the static images with each other and like diffusion weighted images with each other;

an image rejection processor that discards images dissimilar to other like diffusion weighted and static images by more than a predetermined threshold;

an image combining means for combining the remaining static images and like diffusion weighted images into combined static and diffusion weighted images;

a diffusion analysis processor that (1) calculates a diffusion tensor coefficient from the combined images for each voxel of at least a region of interest, (2) creates eigenvectors from the diffusion tensors, and (3) tracks an anisotropic structure with the eigenvectors;

a video processor and monitor for generating a human viewable display of the tracked anisotropic structure.

15. The magnetic resonance apparatus as set forth in claim 14, further including:

a subject restraint device for securing a region of interest of a subject over a plurality of magnetic resonance scan sequences, reducing the occurrences of image shifts over the plurality of scan sequences.

16. The magnetic resonance apparatus as set forth in claim 14, wherein the comparator at least one of:

analyzes the images for macroscopic shifts indicative of subject motion; and analyzes the images for isolated distortion indicative of non-uniformities of the main magnetic field.

17. The magnetic resonance apparatus as set forth in claim 16, further including:

an image adjustment processor that applies local adjustments to detected areas of isolated distortion.

18. The magnetic resonance apparatus as set forth in claim 14, further including:

key an image alignment processor that aligns the static images and the like diffusion weighted images with respect to each other.

19. A method of diffusion weighted magnetic resonance imaging comprising:

generating a plurality of static image representations and for each static image representation generating a plurality of contemporaneous diffusion image representations with each of a plurality of diffusion weightings of the same region of interest in a subject;

aligning each static image and the contemporaneous diffusion weighted images analogously;

rejecting images that differ from other static and like diffusion weighted images;

combining the non-rejected static images and non-rejected diffusion weighted images with like diffusion weighting;

diffusion analyzing the combined static and diffusion weighted images to image an anisotropic structure.

20. The method as set forth in claim 19, wherein the aligning step includes:

aligning the images macroscopically with respect to global shifts in the images;

adjusting the images locally with respect to localized distortions in the images.

* * * * *